United States Patent
Perner et al.

(10) Patent No.: US 6,982,909 B2
(45) Date of Patent: *Jan. 3, 2006

(54) SYSTEM AND METHOD FOR READING A MEMORY CELL

(75) Inventors: Frederick A. Perner, Palo Alt, CA (US); Kenneth K. Smith, Boise, ID (US); Corbin L. Champion, Pullman, WA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 8 days.

This patent is subject to a terminal disclaimer.

(21) Appl. No.: 10/765,483

(22) Filed: Jan. 27, 2004

(65) Prior Publication Data

US 2005/0007830 A1    Jan. 13, 2005

Related U.S. Application Data

(63) Continuation-in-part of application No. 10/614,504, filed on Jul. 7, 2003, now Pat. No. 6,836,422.

(51) Int. Cl.
*G11C 7/00* (2006.01)
(52) U.S. Cl. .................. 365/189.07; 365/148; 365/158
(58) Field of Classification Search ........... 365/189.07, 365/148, 158, 171, 173
See application file for complete search history.

(56) References Cited

U.S. PATENT DOCUMENTS

| | | | |
|---|---|---|---|
| 6,081,453 A * | 6/2000 | Iwahashi | ............... 365/185.22 |
| 6,169,686 B1 | 1/2001 | Brug et al. | |
| 6,259,644 B1 | 7/2001 | Tran et al. | |
| 6,567,297 B2 | 5/2003 | Baker | |
| 6,836,422 B1 * | 12/2004 | Perner et al. | ........... 365/189.07 |
| 6,865,108 B2 * | 3/2005 | Smith et al. | ................ 365/171 |
| 2002/0101758 A1 | 8/2002 | Baker | |
| 2003/0039162 A1 | 2/2003 | Baker | |

OTHER PUBLICATIONS

"Nonvolatile RAM based on Magnetic Tunnel Junction Elements" by M. Durlam et al. 2000 IEEE International Solid-State Circuits Conference 07803-5853-8/00, Motorola Labs, Physical Sciences Research Labs, Tempe, AZ, Section TA 7.3.

"A 10ns Read and Write Non-volatile Memory Array Using a Magnetic Tunnel Junction and FET Switch in each Cell" by Roy Scheuerlain et al. 2000 IEEE International Solid-State Circuits Conference 07803-5853-8/00, IBM Research Almaden Research Center, San Jose, CA, Section TA 7.2.

"Offset Compensating Bit-Line Sensing Scheme for High Density DRAM's" by Yohi Watanabe et al., IEE Jurnal of Solid-State Circuits, vol. 29, No. 1, Jan. 1994.

* cited by examiner

Primary Examiner—Gene N. Auduong

(57) ABSTRACT

A method of performing a read operation from a first magnetic random access memory (MRAM) cell in a memory cell string that includes the first MRAM cell coupled to a second MRAM cell. The method includes providing a voltage to a first end of the first memory cell string that is closest to the first MRAM cell, providing a ground source to a second end of the first memory cell string that is opposite the first end, and determining whether a voltage change occurred at a node between the first and second MRAM cells in response to applying a write sense current to the first MRAM cell.

15 Claims, 10 Drawing Sheets

US 6,982,909 B2

SYSTEM AND METHOD FOR READING A MEMORY CELL

REFERENCE TO RELATED APPLICATION

This application is a continuation-in-part of commonly assigned U.S. patent application Ser. No. 10/614,504, filed Jul. 7, 2003 now U.S. Pat. No. 6,836,422, of which priority is hereby claimed.

BACKGROUND

Magnetic Random Access Memory ("MRAM") is a non-volatile memory that may be suitable for long term data storage. MRAM devices may perform read and write operations faster than conventional long term storage devices such as hard drives. In addition, MRAM devices may be more compact and may consume less power than conventional storage devices.

A typical MRAM device may include an array of memory cells where word lines extend along-rows of the memory cells and bit lines extend along columns of the memory cells. Each memory cell may be located at a cross point of a word line and a bit line.

A memory cell in an MRAM device stores a bit of information according to an orientation of a magnetization. The magnetization of a memory cell assumes one of two stable orientations at a given time. These two orientations are known as parallel and anti-parallel and represent logic level values of "0" and "1", respectively.

The magnetization orientation affects the resistance of a memory cell such as a spin dependent tunneling junction device. For instance, the resistance of a memory cell is a first value R if the magnetization orientation is parallel; the resistance of the memory cell increases to a second value (R+ΔR) if the magnetization orientation changes from parallel to anti-parallel. The magnetization orientation of a selected memory cell, and therefore the logic state of the memory cell, may be read by determining the resistance state of the selected memory cell.

One of the challenges with MRAM devices involves electrically isolating the circuits that comprise the memory cells while maintaining a sufficient level of packing density. Although additional components such as transistors may be used to increase the isolation of memory cells, an increase in the number of components typically results in a decrease in the packing density of the memory cells, i.e., the number of memory cells per a given area. A decrease in the packing density generally results in increased costs. It would be desirable to be able to increase packing densities while increasing the electrical isolation of memory cells and while improving the read performance of the MRAM memory.

SUMMARY

In one exemplary embodiment, the present disclosure provides a method of performing a read operation from a first magnetic random access memory (MRAM) cell in a memory cell string that includes the first MRAM cell coupled to a second MRAM cell. The method includes providing a voltage to a first end of the first memory cell string that is closest to the first MRAM cell, providing a ground source to a second end of the first memory cell string that is opposite the first end, and determining whether a voltage change occurred at a node between the first and second MRAM cells in response to applying a write sense current to the first MRAM cell.

BRIEF DESCRIPTION OF THE DRAWINGS

Exemplary embodiments of the invention are better understood with reference to the following drawings. The elements of the drawings are not necessarily to scale relative to each other. Like reference numerals designate corresponding similar parts.

FIG. 9b is a first diagram illustrating applying a write sense current to the MRAM memory cell shown in FIG. 9a.

DETAILED DESCRIPTION

Figure 1:
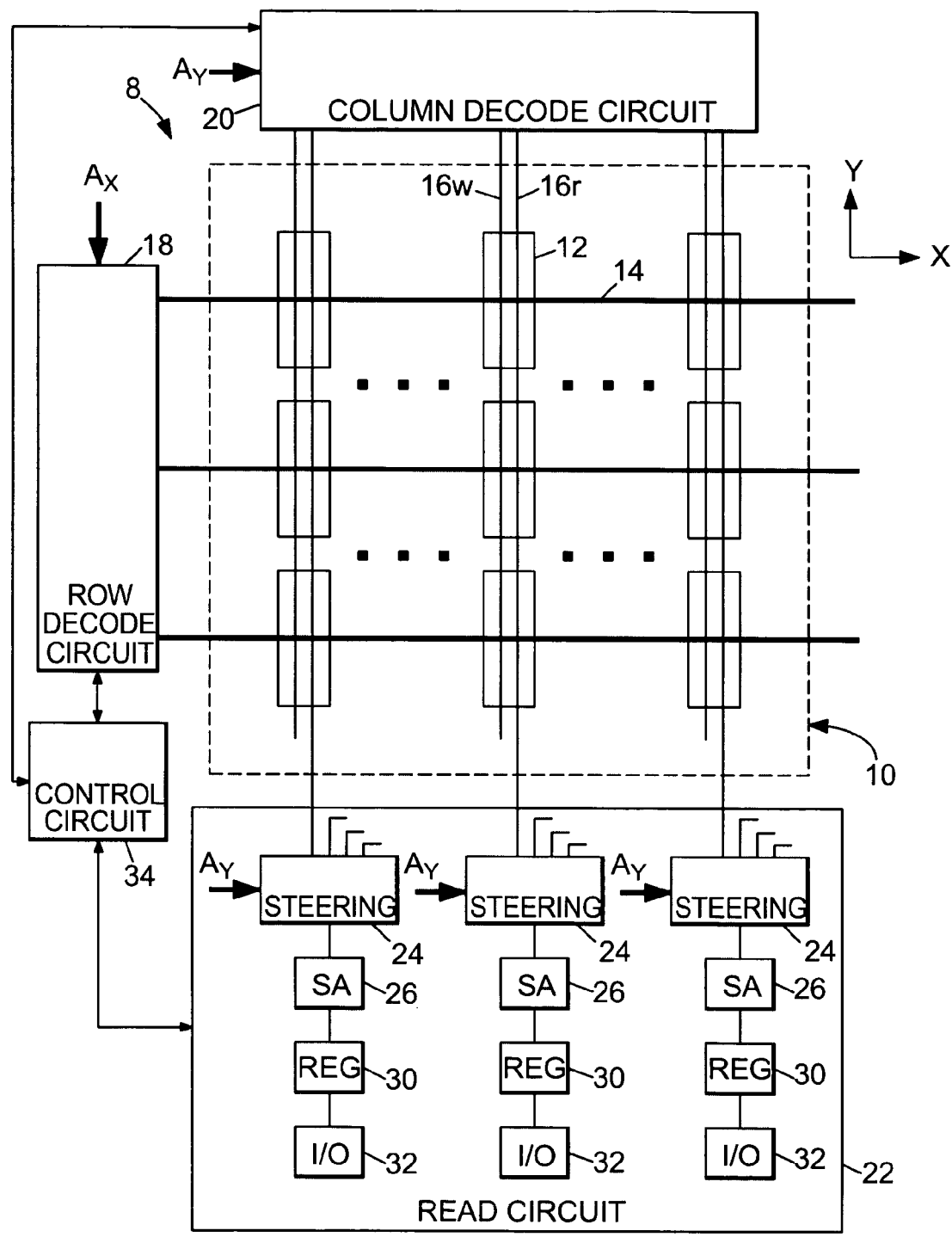
FIG. 1 is a diagram illustrating an embodiment of a data storage device that includes memory cell strings.

As shown in the drawings for purposes of illustration, the present invention is embodied in an MRAM device. In one embodiment, the MRAM device includes an array of memory cells and circuitry for reliably sensing resistance states of the memory cells. The array of memory cells is divided into memory cell strings as described herein. To read a memory cell in a memory cell string, the output of a voltage divider circuit is determined before and after the memory cell is written to a first state using a write current. If the voltage divider output does not change after the memory cell is written to the first state, then the memory cell was in the first state prior to being written to the first state. If the voltage divider output changes after the memory cell is written to the first state, then the memory cell was in a second state prior to being written to the first state. In this case, the memory cell is written back to the second state.

In another embodiment, the MRAM device includes an array of memory cells and circuitry for reliably sensing resistance states of the memory cells. The array of memory cells is divided into memory cell strings as described herein. To read a memory cell in a memory cell string, the output of a voltage divider circuit is determined before and after a write sense current, as described herein below, is applied across the memory cell. If the voltage divider output does not change after the write current is applied, then the memory cell is in a first state. If the voltage divider output changes after the write sense current is applied, then the memory cell is in a second state.

Figure 3:
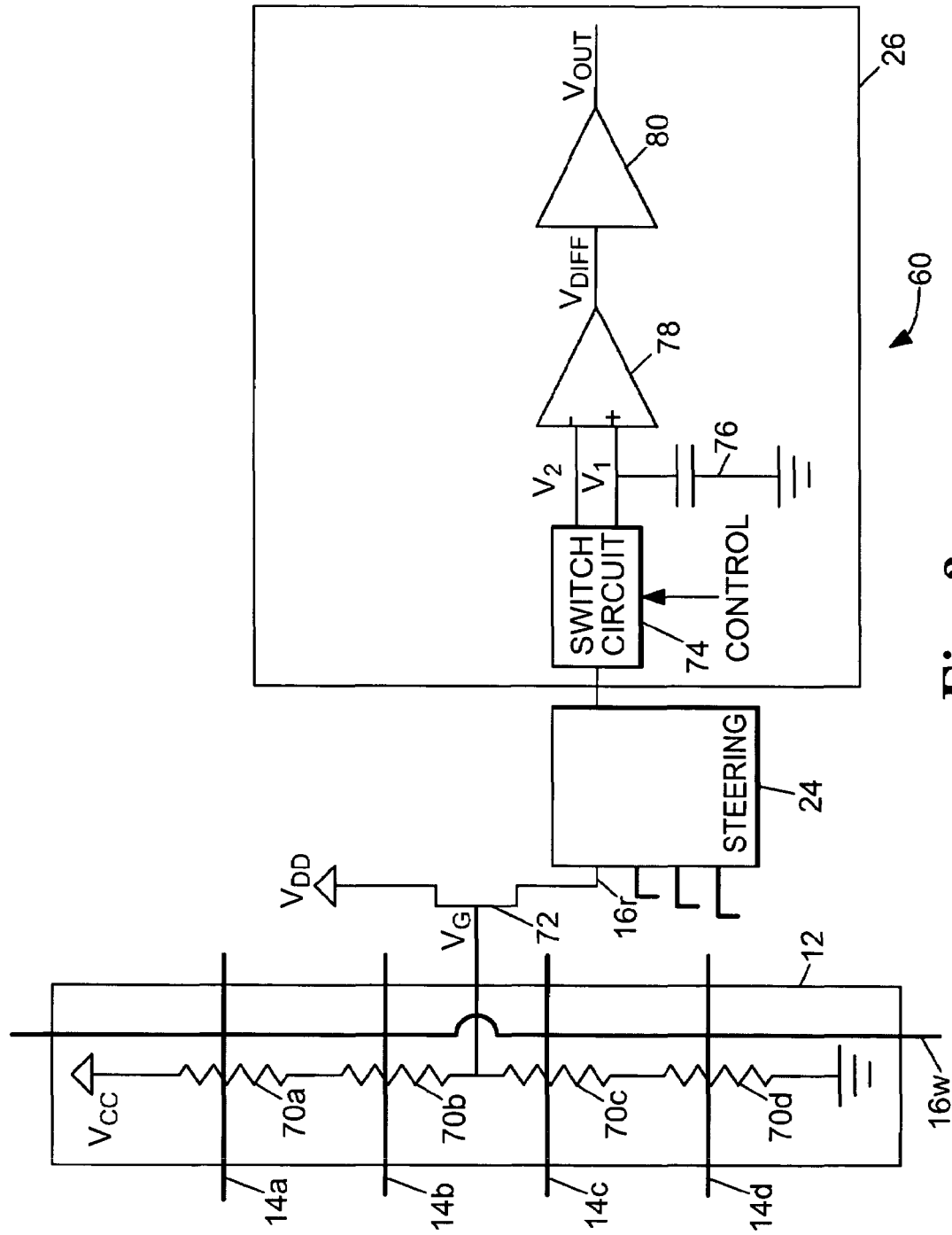
FIG. 3 is a diagram illustrating an embodiment of a first system for reading a memory cell in a memory cell string.
Figure 5:
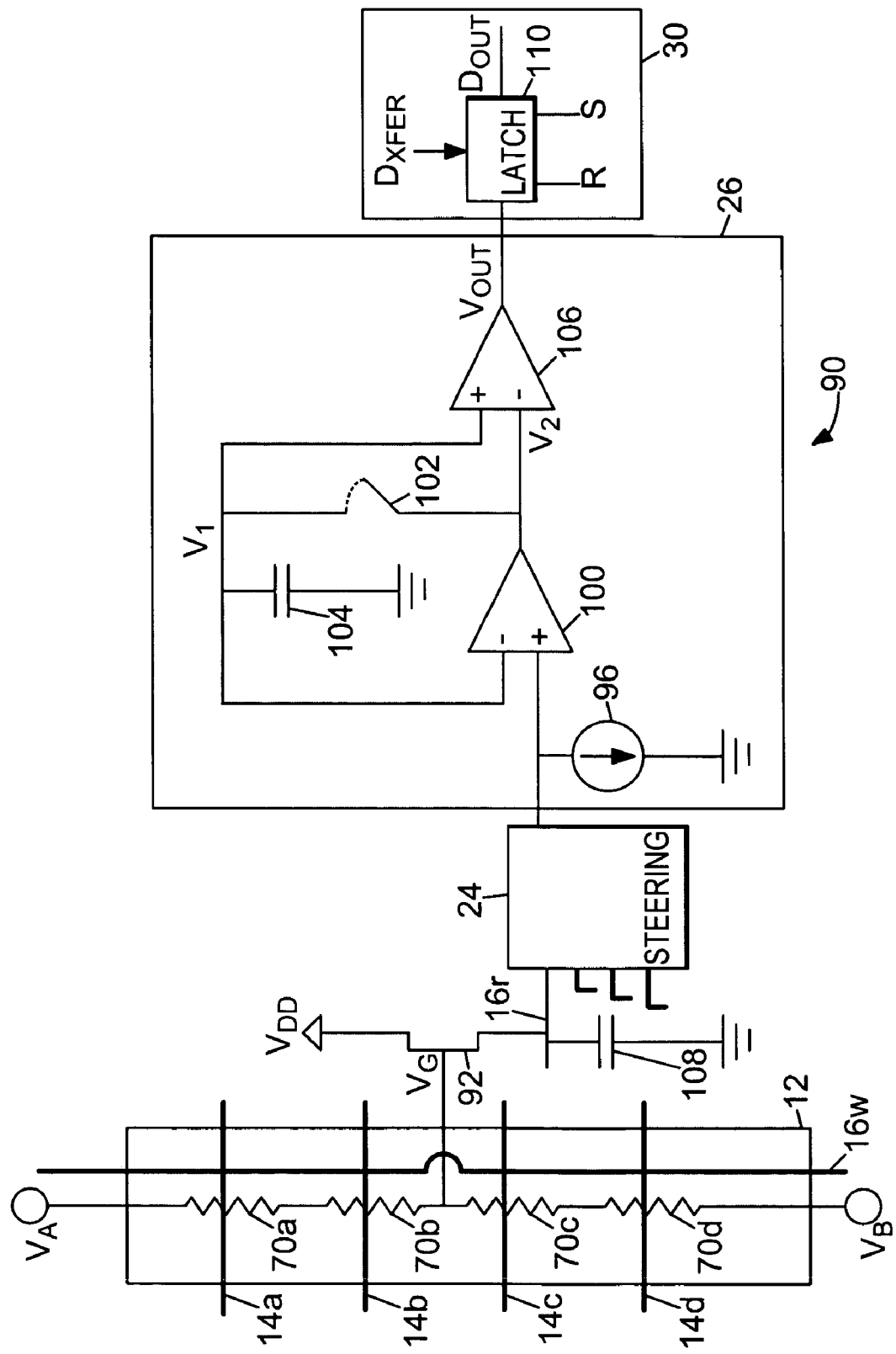
FIG. 5 is a diagram illustrating an embodiment of a second system for reading a memory cell in a memory cell string.

Reference is now made to FIG. 1, which illustrates an embodiment of an MRAM device 8 including an array 10 of memory cell strings 12. Each memory cell string includes a plurality of memory cells as shown in the embodiments of FIGS. 3 and 5. The memory cell strings 12 are arranged in rows and columns, with the rows extending along an x-direction and the columns extending along a y-direction. Only a relatively small number of memory cell strings 12 are shown to simplify the description of the invention. In practice, arrays of any size may be used with any number of memory cell strings. The memory cell strings may each include any number of memory cells greater than or equal to two.

Traces functioning as word lines 14 extend along the x-direction in a plane on one side of the memory cell array 10. The word lines 14 shown in FIG. 1 represent one word line for each memory cell in memory cell strings 12. Traces functioning as write and read bit lines 16w and 16r, respectively, extend along the y-direction in a plane on an opposite side of the memory cell array 10. Each memory cell in memory cell strings 12 is located at a cross point of a corresponding word line 14 and bit lines 16w and 16r.

The memory cells are not limited to any particular type of device. For example the memory cells may be spin dependent tunneling ("SDT") junction devices.

Figure 2A:
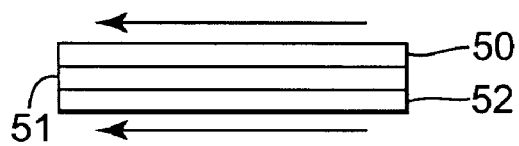
FIG. 2a is a diagram illustrating an embodiment of a parallel magnetization orientation of an MRAM memory cell.
Figure 2B:
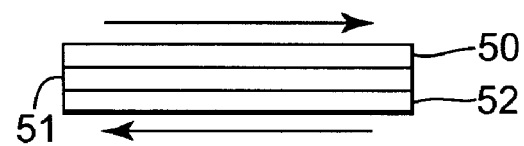
FIG. 2b is a diagram illustrating an embodiment of an anti-parallel magnetization orientation of an MRAM memory cell.

Referring now to FIGS. 2a and 2b, an SDT junction device includes a pinned layer 52 having a magnetization that is oriented in a plane of the pinned layer 52 but fixed so as not to rotate in the presence of an applied magnetic field in a range of interest. The SDT junction device also includes a "free" layer 50 having a magnetization orientation that is not pinned. Rather, the magnetization can be oriented in either of two directions along an axis (the "easy" axis) lying in the plane of the free layer 50. If the magnetization of the free and pinned layers 50 and 52 are in the same direction, the orientation is said to be "parallel" (as indicated by the arrows in FIG. 2a). If the magnetization of the free and pinned 50 and 52 layers are in opposite directions, the orientation is said to be "anti-parallel" (as indicated by the arrows in FIG. 2b). The magnetization in the free layer 50 may be oriented by applying write currents to word and bit lines 14 and 16w that cross the memory cell.

The free and pinned layers 50 and 52 are separated by an insulating tunnel barrier 51. The insulating tunnel barrier 51 allows quantum mechanical tunneling to occur between the free and pinned layers 50 and 52. This tunneling phenomenon is electron spin dependent, making the resistance of the SDT junction device a function of the relative orientations of the magnetization of the free and pinned layers 50 and 52. For instance, resistance of the SDT junction device is a first value R if the orientation of magnetization of the free and pinned layers 50 and 52 is parallel and a second value (R+ΔR) if the orientation of magnetization is anti-parallel.

Returning to FIG. 1, the MRAM device 8 also includes a row decode circuit 18. During write operations, the row decode circuit 18 applies a write current to a selected word line 14 to cause a memory cell to be written to a desired state. During read operations, the row decode circuit 18 applies a write current to a selected word line 14 to cause a memory cell to be written to a known state and may apply a write current to the selected word line 14 to cause the memory cell to be written to a previous state. In another embodiment described below with respect to FIGS. 9a through 9d, 10, and 11, the row decode circuit 18 applies a write sense current to a selected word line 14 to cause a reference layer of a memory cell to be set to a known state during read operations.

The MRAM device 8 further includes a column decode circuit 20. During write operations, the column decode circuit 20 applies a write current to selected bit lines 16w. During read operations, column decode circuit 20 applies a write current to a selected bit line 16w to cause a memory cell to be written to a known state and may apply a write current to the selected bit line 16w to cause the memory cell to be written to a previous state. Also during read operations, column decode circuit 20 selects a memory cell string 12 and connects the memory cell string 12 via bit line 16r to detection circuit 26 using steering circuit 24. In the embodiment described below with respect to FIGS. 9a through 9d, 10, and 11, the column decode circuit 20 may also apply a write sense current to the selected bit lines 16 during read operations. Column decode circuit 20 also selects a memory cell string 12 and connects the memory cell string 12 via bit line 16r to detection circuit 26 using steering circuit 24.

The MRAM device 8 further includes a read circuit 22 for sensing the resistance of selected memory cells during read operations and a write circuit (not shown) for orienting the magnetization of selected memory cells during write operations.

The read circuit 22 includes a plurality of steering circuits 24 and sense amplifiers 26. Multiple bit lines 16r are connected to each steering circuit 24. Each steering circuit 24 includes a set of switches that connects a selected bit line 16r and a selected memory cell string 12 to a sense amplifier 26. An output of the sense amplifier 26 is supplied to a data register 30, which, in turn, is coupled to an I/O pad 32 of the MRAM device 8. If the MRAM device 8 has multiple levels of memory cell arrays (see, for example, FIG. 7), bit lines 16r and memory cell strings 12 from the additional levels may be multiplexed into the sense amplifiers 26.

Control circuit 34 provides control signals such as timing signals to row decode circuit 18, column decode circuit 20, and read circuit 22.

FIG. 3 illustrates an embodiment of a system 60 for reading a memory cell 70 in a memory cell string 12. System 60 includes one embodiment of memory cell string 12 and one embodiment of sense amplifier 26. Memory cell string 12 is coupled to a transistor 72; transistor 72 is coupled to bit line 16r and steering circuit 24; and steering circuit 24 is coupled to bit line 16r and sense amplifier 26.

Memory cell string 12 includes memory cells 70a, 70b, 70c, and 70d, represented by resistors, coupled in series. Word lines 14a, 14b, 14c, and 14d are used to write memory cells 70a, 70b, 70c, and 70d, respectively, in conjunction with bit line 16w. A voltage source, $V_{CC}$, is coupled to one end of memory cell string 12 and the other end of memory cell string 12 is coupled to a ground source. The value of $V_{CC}$ may be set to be equal to the sense voltage times the number of memory cells 70 in memory cell string 12. If the sense voltage is 0.5, for example, then $V_{CC}$ for the embodiment of FIG. 3 may be set to 0.5V times 4 or 2.0V. The $V_{CC}$ of unselected memory cell strings 12 is set at the ground potential. The voltage source provides a voltage across memory cell string 12 in response to control signals received from row decode circuit 18, column decode circuit 20, and/or control circuit 34. In particular, the voltage source provides a voltage to the memory cell string 12 in response to a read operation to allow one or more of memory cells 70a, 70b, 70c, and 70d to be read.

In the embodiment of FIG. 3, the gate connection of transistor 72 is coupled to the node between memory cells 70b and 70c; the drain connection of transistor 72 is coupled to a voltage source, $V_{DD}$; and the source connection of transistor 72 is coupled to bit line 16r. Memory cells 70a, 70b, 70c, and 70d form a voltage divider, and node $V_G$ forms a voltage tap in memory cell string 12. Transistor 72 is operated as a source follower to reflect the voltage present at the gate connection, $V_G$, to the source connection in response to the voltage, $V_{CC}$, being applied to memory cell string 12. Accordingly, transistor 72 causes the voltage present at the node between memory cells 70b and 70c to be reflected on bit line 16r.

Each memory cell string 12 in array 10 is coupled to a transistor 72 which is coupled to a bit line 16r. Each transistor 72 may be physically located near the memory cell string 12 to which it is coupled. By applying a voltage, $V_{CC}$, to a selected memory cell string 12 coupled to a bit line 16r, row decode circuit 18 causes the voltage, $V_G$, from the selected memory cell string 12 to be reflected onto the bit line 16r as will be described in additional detail below. A voltage, $V_{CC}$, is not applied to the other memory cell strings 12 coupled to the bit line 16r during the time the voltage, $V_G$, from the unselected memory cell string 12 is not reflected onto the bit line 16r.

Each steering circuit 24 is coupled to from 4 to 256 bit lines 16r. According, steering circuit 24 is coupled to the source connection of transistor 72 for each bit line 16r. Steering circuit 24 provides the voltage from a selected bitline 16r, which in turn is coupled to memory cell string 12 via voltage follower transistor 72, to sense amplifier 26.

Sense amplifier 26 is coupled to bit line 16r, a node between memory cells 70b and 70c through transistor 72 and steering circuit 24. Sense amplifier 26 includes a switch circuit 74, a capacitor 76, a differential amplifier 78, and a signal amplifier 80.

Switch circuit 74 is configured to selectively couple bit line 16r to one of the inputs of differential amplifier 78 in response to a control signal. The control signal causes switch circuit 74 to couple bit line 16r to the positive input of differential amplifier 78 to transmit a first voltage, $V_1$, at a first time. Capacitor 76 stores the first voltage for a limited time. At a second time, the control signal causes switch circuit 74 to couple bit line 16r to the negative input of differential amplifier 78 to transmit a second voltage, $V_2$.

In response to the first and second voltages, differential amplifier 78 generates a differential output voltage, $V_{DIFF}$, which is provided to signal amplifier 80. Signal amplifier 80 amplifies the differential output voltage to a logic output voltage, $V_{OUT}$, that can be stored as a logic level, i.e., a "0" or a "1".

Figure 4:
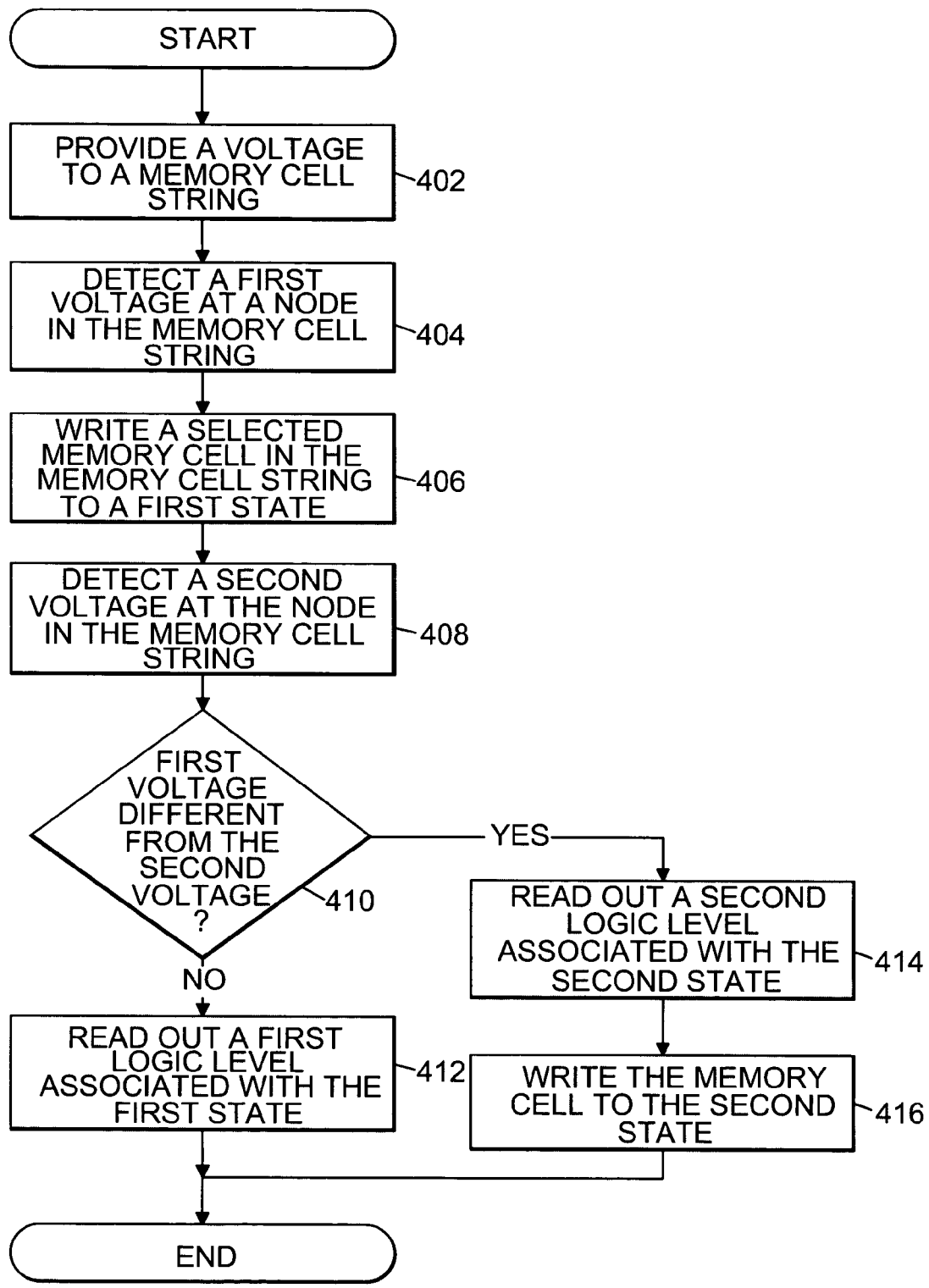
FIG. 4 is a flow chart illustrating an embodiment of a first method for reading a memory cell in memory cell string.

FIG. 4 is a flow chart illustrating an embodiment of a method for reading a memory cell in the embodiment of memory cell string 12 shown in FIG. 3. In FIG. 4, a voltage, $V_{CC}$, is provided to memory cell string 12 as indicated in a block 402. A first voltage is detected at a node in memory cell string 12 as indicated in a block 404. In particular, transistor 72 and switching circuit 74 cause the voltage present at the node $V_G$ between memory cells 70b and 70c at a first point in time to be detected and stored on capacitor 76 as described above.

A selected memory cell in memory cell string 12, e.g., memory cell 70b, is written to a first state as indicated in a block 406. In one embodiment, the first state may be anti-parallel to represent a logic level of "1". In other embodiments, the first state may be parallel to represent a logic level of "0".

A second voltage is detected at a node in memory cell string 12 as indicated in a block 408. In particular, transistor 72 and switching circuit 74 cause the voltage present at the node $V_G$ between memory cells 70b and 70c at a second point in time to be detected and provided to the negative input of differential amplifier 78. The second voltage is detected subsequent to the selected memory cell, e.g., memory cell 70b, being written to the first state.

A determination is made by sense amplifier 26 as to whether the first voltage differs from the second voltage as indicated in a block 410. The determination is made using differential amplifier 78 and signal amplifier 80. If the first voltage does not differ from the second voltage, then a first logic level associated with the first state is read out from the selected memory cell, e.g., memory cell 70b, as indicated in a block 412. If the first voltage differs from the second voltage, then a second logic level associated with the second state is read out from the selected memory cell, e.g., memory cell 70b, as indicated in a block 414. In addition, the selected memory cell, e.g., memory cell 70b, is written to the second state as indicated in a block 416.

Sense amplifier 26 causes the first or second logic level to be read out from the selected memory cell by causing a "1" or a "0" to be stored in register 30 and to be provided to I/O pad 32.

As noted above, the parallel state and the anti-parallel state cause different resistances to be measured across a memory cell. By applying a voltage across memory cell string 12, a voltage can be detected at a node between memory cells in the string prior to and subsequent to a selected memory cell being written to a known state. If the known state matches the previous state of the selected memory cell, then the resistance of the cell will not change and the voltage detected at the node subsequent to the write will be roughly the same as the voltage detected at the node prior to the write. If the known state does not match the previous state of the selected memory cell, then the resistance of the cell will change and the voltage detected at the node subsequent to the write will differ from the voltage detected at the node prior to the write. In this way, memory cell string 12 effectively functions as a voltage divider circuit.

If the write in block 406 caused the state of the selected memory cell to change, then the memory cell is re-written to its original state as illustrated by block 416. If the write in block 406 did not cause the state of the selected memory cell to change, then the memory cell remains in its original state and may not need to be re-written.

Control circuit 34 provides appropriate timing signals to row decode circuit 18, column decode circuit 20, read circuit 22, steering circuit 24 and sense amplifier 26 to allow the functions of the method shown in FIG. 4 to be performed.

Any one of the memory cells 70a, 70b, 70c, and 70d may be read using the method just described. Although four memory cells are shown in the memory cell string illustrated in FIG. 3, other memory cell strings may include other numbers of memory cells coupled in series.

Although the gate connection of transistor 72 is coupled to the node between memory cells 70b and 70c in the embodiment shown in FIG. 3, the gate connection may be coupled to a node between other memory cells, such as the node between memory cells 70a and 70b or the node between memory cells 70c and 70d, in other embodiments.

In addition, the source connection of transistor 72 may be coupled to the node between memory cells 70b and 70c, the gate connection of transistor 72 may be coupled to a voltage source and the drain connection of transistor 72 may be coupled to bit line 16 in other embodiments. Alternatively in other embodiments, the drain connection of transistor 72 may be coupled to the node between memory cells 70b and 70c, the gate connection of transistor 72 may be coupled to a voltage source and the source connection of transistor 72 may be coupled to bit line 16 in other embodiments.

Transistor 72 comprises a voltage follower transistor. In other embodiments, transistor 72 may be a bi-polar transistor and may be configured as an emitter follower in one or more of these embodiments.

FIG. 5 illustrates an embodiment of a system 90 for reading a memory cell 70 in a memory cell string 12. System 90 includes one embodiment of memory cell string 12, one embodiment of sense amplifier 26, and one embodiment of register 30. Memory cell string 12 is coupled to a transistor 92, transistor 92 is coupled to bit line 16r and steering circuit 24, and steering circuit 24 is coupled to bit line 16r and sense amplifier 26.

Memory cell string 12 includes memory cells 70a, 70b, 70c, and 70d, represented by resistors, coupled in series. Word lines 14a, 14b, 14c, and 14d are used to write memory cells 70a, 70b, 70c, and 70d, respectively, in conjunction with bit line 16w.

A voltage source, $V_A$ or $V_B$, may be selectively coupled to either end of memory cell string 12 with a ground source coupled to the opposite end of the coupled voltage source. Both ends of unselected memory cell strings 12 are coupled to ground sources. The voltage source $V_A$ or $V_B$ is selected with reference to the memory cell to be read. In particular, $V_A$ is coupled to memory cell string 12 and a ground source is coupled to the other end of memory cell string 12 to read memory cell 70a or 70b. Similarly, $V_B$ is coupled to memory cell string 12 and a ground source is coupled to the other end of memory cell string 12 to read memory cell 70c or 70d. The voltage sources $V_A$ and $V_B$ provide a voltage across memory cell string 12 in response to control signals received from row decode circuit 18, column decode circuit 20, and/or control circuit 34. In one embodiment, column decode circuit 20 causes $V_A$ or $V_B$ to be provided to memory cell string 12 to select string 12 and allow a read operation to be performed on a memory cell 70 in string 12.

In the embodiment of FIG. 5, the gate connection of transistor 92 is coupled to the node between memory cells 70b and 70c, the drain connection of transistor 92 is coupled to a voltage source, $V_{DD}$, and the source connection of transistor 92 is coupled to bit line 16r. The node $V_G$ forms a voltage tap in memory cell string 12. Transistor 92 is operated as a source follower to reflect the voltage present at the gate connection, $V_G$, to the source connection in response to the voltage, $V_{DD}$, being applied to the drain connection. Accordingly, transistor 92 causes the voltage present at the node $V_G$ between memory cells 70b and 70c to be reflected on bit line 16r.

Each memory cell string 12 in array 10 is coupled to a transistor 92 which is coupled to a bit line 16r. Each transistor 92 may be physically located near the memory cell string 12 to which it is coupled. By applying a voltage, $V_A$ or $V_B$, to a selected memory cell string 12 coupled to a bit line 16r, row decode circuit 18 causes the voltage, $V_G$, from the selected memory cell string 12 to be reflected onto the bit line 16r as will be described in additional detail below. A voltage, $V_A$ or $V_B$, is not applied to the other memory cell strings 12 coupled to the bit line 16r during the time the voltage, $V_G$, from the unselected memory cell string 12 is not reflected onto the bit line 16r.

Each steering circuit 24 is coupled to from 4 to 256 bit lines 16r. According, steering circuit 24 is coupled to the source connection of transistor 92 for each bit line 16r. Steering circuit 24 provides the voltage from a selected bitline 16r, which in turn is coupled to memory cell string 12 via voltage follower transistor 92, to sense amplifier 26.

Sense amplifier 26 is coupled to bit line 16r and a node between memory cells 70b and 70c through transistor 92 and steering circuit 24. Sense amplifier 26 comprises a clocked, two stage, self-referencing amplifier and includes a transistor 92, a current source 96, a differential amplifier 100, a switch 102, a capacitor 104, and a differential amplifier 106.

Capacitor 108 represents the load on bit line 16r caused by other memory cell strings 12 coupled to bit line 16r. Current source 96 is operable to discharge or act as the load on bit line 16r to increase the speed of the circuit. In other embodiments, current source 96 may be replaced by a resistor.

Bit line 16r is coupled through steering circuit 24 to the positive input of differential amplifier 100. Differential amplifier 100 comprises the first stage of sense amplifier 26. The first state causes sense amplifier 26 to be self-referenced by compensating for voltage, temperature, memory cell resistance, and system variations.

The output of differential amplifier 100 is coupled to switch 102. Switch 102 is configured to couple the output of differential amplifier 100 to capacitor 104, the negative input of differential amplifier 106, and the positive input of differential amplifier 106 in response to being closed. When closed, switch 102 effectively causes a first voltage, $V_1$, from bit line 16r to be stored across capacitor 104 at a first time. In response to being opened, switch 102 causes the output of differential amplifier 100 to be coupled only to the negative input of differential amplifier 106. As a result, a second voltage from bit line 16r, $V_2$, is coupled to the input of differential amplifier 106 at a second time.

Current source 96, differential amplifier 100, switch 102, and capacitor 104 operate as a charge-balanced sample and hold circuit to set a reference voltage for both stages of sense amplifier 26.

Differential amplifier 106 comprises the second stage of sense amplifier 26. Differential amplifier 106 compares the first and second voltages and produces a differential output voltage, $V_{OUT}$.

The differential output voltage is provided to sense latch 110. Sense latch 110 is reset to a high impedance state using the reset 'R' input prior to receiving the output from differential amplifier 106. In response to the data transfer signal, $D_{XFER}$, the differential output voltage is stored in a sense latch 110 as a logic level, i.e., a "0" or a "1". Sense latch 110 amplifies the output signal, $D_{OUT}$, to a full scale output signal. Sense latch 110 is part of register 30.

Figure 6:
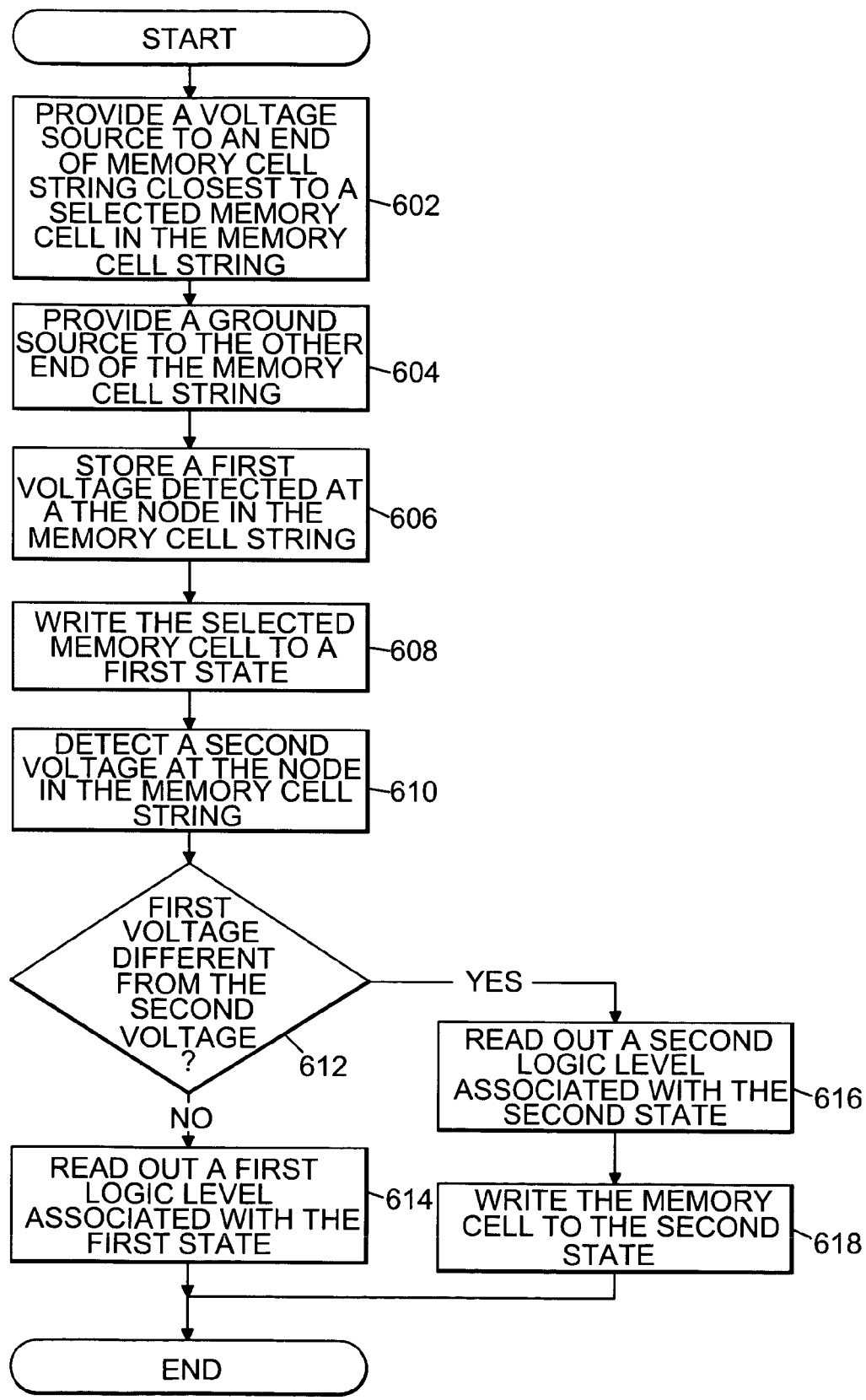
FIG. 6 is a flow chart illustrating an embodiment of a second method for reading a memory cell in memory cell string.

FIG. 6 is a flow chart illustrating an embodiment of a method for reading a selected memory cell in the embodiment of memory cell string 12 shown in FIG. 5. In FIG. 6, a voltage source is provided to an end of a memory cell string 12 closest or nearest to the selected memory cell in the memory cell string as indicated in a block 602. A ground source is provided to the other end of memory cell string 12 as indicated in a block 604.

The voltage source and ground source are coupled to cause the selected memory cell to be closest to the supply voltage ($V_A$ or $V_B$) of the voltage divider circuit formed by the voltage source, the ground source, and memory cells 70a, 70b, 70c, and 70d. Accordingly, the end of memory cell string 12 that is closest or nearest to a selected memory cell 70 is the end that would put the selected memory cell between voltage source $V_A$ or $V_B$ and the voltage divider tap node $V_G$. This closest end is coupled to a voltage source $V_A$ or $V_B$ and the end opposite the closest end is coupled to a ground source. The supply voltage $V_A$ or $V_B$ may be coupled to $V_{DD}$.

For example, if memory cell 70a or 70b is selected to be read, then the voltage $V_A$ is applied across memory cell string 12 and the end of memory cell string 12 indicated by $V_B$ is coupled to a ground source. If memory cell 70c or 70d is selected to be read, then the voltage $V_B$ is applied as indicated in FIG. 5 and the end of memory cell string 12 indicated by $V_A$ is coupled to a ground source.

By switching the voltage and ground sources based on the relative position of the selected memory cell in the memory cell string as just described, the signals provided to sense amplifier 26 may be at a desired polarity to allow the design of sense amplifier 26 to be simplified.

A first voltage detected at a node in memory cell string 12 is stored as indicated in a block 606. In particular, transistor 92, differential amplifier 100, and switch 102 cause the voltage present at the node $V_G$ between memory cells 70b and 70c at a first point in time to be detected and stored on capacitor 104 as described above. A voltage, $V_A$ or $V_B$, is applied to memory cell string 12 to develop a voltage divider voltage to be applied at the gate of transistor 92 to cause a sense voltage to be transmitted to the input of differential amplifier 100. The voltage, $V_A$ or $V_B$, may be equal to $V_{DD}$.

The selected memory cell in memory cell string 12, e.g., memory cell 70b, is written to a first state as indicated in a block 608. In one embodiment, the first state may be anti-parallel to represent a logic level of "1". In other embodiments, the first state may be parallel to represent a logic level of "0".

A second voltage is detected at a node in memory cell string 12 as indicated in a block 610. In particular, transistor 92, differential amplifier 100, and switch 102 cause the voltage present at the node $V_G$ between memory cells 70b and 70c at a second point in time to be detected and provided to the negative input of differential amplifier 106. The second voltage is detected subsequent to the selected memory cell, e.g., memory cell 70b, being written to the first state.

A determination is made by differential amplifier 106 as to whether the first voltage differs from the second voltage as indicated in a block 612. If the first voltage does not differ from the second voltage, then a first logic level associated with the first state is read out from the selected memory cell, e.g., memory cell 70b, as indicated in a block 614. If the first voltage differs from the second voltage, then a second logic level associated with the second state is read out from the selected memory cell, e.g., memory cell 70b, as indicated in a block 616. In addition, the selected memory cell, e.g., memory cell 70b, is written to the second state as indicated in a block 618.

Sense amplifier 26 causes the first or second logic level to be read out from the selected memory cell by causing a "1" or a "0" to be stored in sense latch 110 in register 30 and to be provided to I/O pad 32.

Memory cell string 12 effectively functions as a voltage divider circuit in the embodiment of FIG. 5.

If the write in block 608 caused the state of the selected memory cell to change, then the memory cell is re-written to its original state as illustrated by block 618. If the write in block 608 did not cause the state of the selected memory cell to change, then the memory cell remains in its original state and may not need to be re-written.

Control circuit 34 provides appropriate timing signals to row decode circuit 18, column decode circuit 20, read circuit 22, steering circuit 24 and sense amplifier 26 to allow the functions of the method shown in FIG. 6 to be performed.

Any one of the memory cells 70a, 70b, 70c, and 70d may be read using the method just described. Although four memory cells are shown in the memory cell string illustrated in FIG. 5, other memory cell strings may include other numbers of memory cells coupled in series.

Although the gate connection of transistor 92 is coupled to the node between memory cells 70b and 70c in the embodiment shown in FIG. 5, the gate connection may be coupled to a node between other memory cells, such as the node between memory cells 70a and 70b or the node between memory cells 70c and 70d, in other embodiments.

Transistor 92 comprises a voltage follower transistor. In other embodiments, transistor 92 may be a bi-polar transistor in other embodiments and may be configured as an emitter follower in one or more of these embodiments.

In certain embodiments of memory cell string 12 described herein, the number of memory elements in a memory cell string 12 is equal to the preselected amount of sense voltage to be set across a single memory cell divided into the supply voltage ($V_{CC}$, $V_A$, or $V_B$) taken in groups of two. For example, if the sense voltage to be set is 0.5V and the supply voltage is 2.0V, then the preferred number of resistors in the string is 4. However, if the sense voltage to be set is 0.2V and $V_{DD}$ is 2.0V, then the preferred number of resistors is 10.

A feature of memory cell string 12 is that the tap voltage $V_G$ is close to the supply voltage ($V_{CC}$, $V_A$, or $V_B$) divided by 2, regardless of the nominal resistance of the memory cells. If, for example, $V_A=V_{DD}=2.0V$, and there are 4 resistors in the string, $V_G$ is about 1.0V, and if there are 10 resistors in the string, $V_G$ is still about 1.0V.

The memory cell string supply voltage ($V_{CC}$, $V_A$, or $V_B$) is set large enough to activate the source follower transistors (i.e. transistors 72 or 92) to drive the bit lines 16 without significant signal loss. If the threshold voltage ($V_{TH}$) of a source follower transistor is 0.5V and a sense voltage of 0.5V is desired, $V_G=V_{TH}+V_{BL}=0.5V+0.5V=1.0V$, and this will dictate a memory cell string supply voltage of 2.0V.

The relationship between the supply voltage, the voltage across a single memory cell, the number of memory cells in a memory cell string, and the signal sensed by the sense amplifier can be described in additional detail as follows. First, the MRAM resistance change $\Delta R$ is specified as the product of TMR (tunneling magnetoresistance ratio) and the nominal resistance of the MRAM memory cell, R. TMR is a strong function of the voltage applied across the memory cell $V_{CELL}$ and is preferably in the range of 200 mV to 500 mV to yield TMR's of 10% to 35%.

Next, a string of N memory cells will nominally form a voltage divider with roughly an equal voltage drop across each memory cell: $V_{CELL}=V_{CC}/N$. Therefore, if $V_{CC}$ is given to be 2.0V and $V_{CELL}$ is selected to be 500 mV, then N=4 as shown in embodiments of FIGS. 3 and 5. And if $V_{CELL}$ is selected to be 200 mV, then N would be 10.

Further, the sense amplifiers of FIG. 3 and FIG. 5 amplify the difference between the output of the voltage divider formed by the tapped node $V_G$ when the selected memory cell is in state 1 ($V_1$) and in state 2 ($V_2$). The voltage difference is directly related to $V_{CC}$, N, and TMR as shown in the following equations (assuming state 1 is anti-parallel, state 2 is parallel, N=4 where the resistance of the memory cells are represented by $R_1$, $R_2$, $R_3$, and $R_4$, respectively, and $R_1$ is the selected memory cell):

$$V_1 = V_{CC}*(R_1*(1+TMR)+R_2)/(R_1*(1+TMR)+R_2+R_3+R_4) \quad [1]$$

$$V_1 \sim = V_{CC}*(TMR/4+0.5) \quad [2]$$

$$V_2 = V_{CC}*(R_1+R_2)/(R_1+R_2+R_3+R_4) \quad [3]$$

$$V_2 \sim = V_{CC}*0.5 \quad [4]$$

$$V_{DIFF} = V_1 - V_2 \quad [5]$$

$$V_{DIFF} \sim = V_{CC}*TMR/4 \quad [6]$$

$$\text{Generally: } V_{DIFF} = V_{CC}*TMR/N \quad [7]$$

Accordingly, the voltage divider design selects $V_{CC}$, TMR, and N to provide sufficient signal to reliably amplify and sense. For the embodiment shown in FIG. 3, $V_{DIFF}$=2.0V*0.1/4=50 mV.

Figure 7:
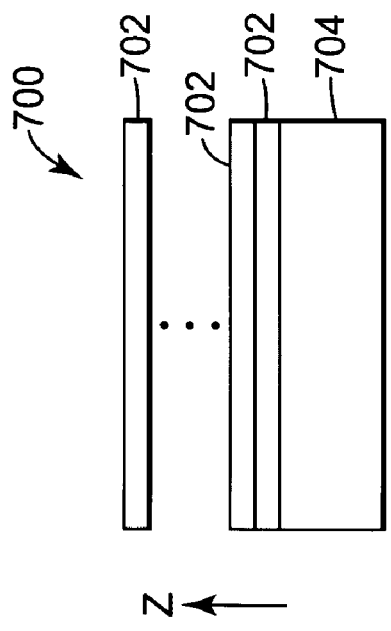
FIG. 7 is a diagram illustrating an embodiment of an MRAM device that includes multiple levels.

Reference is now made to FIG. 7 which illustrates an embodiment of a multi-level MRAM chip 700. MRAM chip 700 includes a number Z of memory cell levels or planes 702 that are stacked in a z-direction on a substrate 704. The number Z is a positive integer where Z>=1. Memory cell levels 702 may be separated by insulating material (not shown) such as silicon dioxide. Read and write circuits may be fabricated on substrate 704. The read and write circuits may include additional multiplexers for selecting the levels that are read from and written to.

Figure 8:
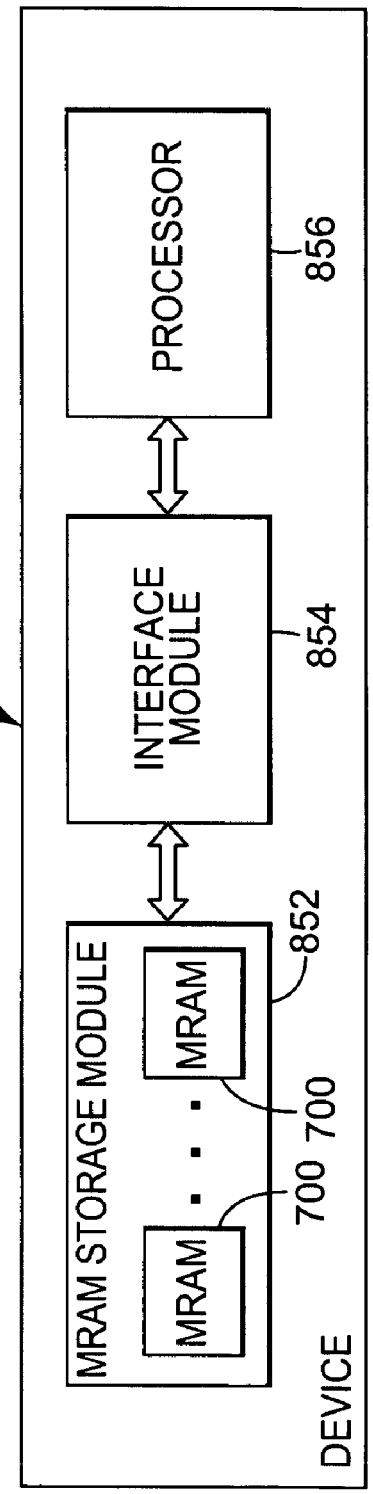
FIG. 8 is a diagram illustrating an embodiment of a system that includes one or more MRAM devices.

Thus, disclosed is an MRAM device in which resistance states of memory cells can be sensed during read operations. The MRAM device described herein may be used in a variety of applications. FIG. 8 shows an exemplary general application for one or more MRAM chips 700. The general application is embodied by a device 850 including a MRAM storage module 852, an interface module 854 and a processor 856. MRAM storage module 852 includes one or more MRAM chips 700 for non-volatile storage. Interface module 854 provides an interface between processor 856 and MRAM storage module 852. Device 850 could also include other types and/or levels of memory.

For a device 850 such as a notebook computer or personal computer, MRAM storage module 852 might include a number of MRAM chips 700 and interface module 854 might include an IDE or SCSI interface. For a device 850 such as a server, MRAM storage module 852 might include a greater number of MRAM chips 700, and interface module 854 might include a Fiber Channel or SCSI interface. Such MRAM storage modules 852 could replace or supplement conventional non-volatile storage devices such as hard drives.

For a device 850 such as a digital camera, MRAM storage module 852 might include a smaller number of MRAM chips 700 and interface module 854 might include a camera interface. Such a MRAM storage module 852 would allow non-volatile storage of digital images on-board the digital camera.

FIGS. 9a through 9d are diagrams illustrating an embodiment of an MRAM memory cell with a soft reference layer 902. The MRAM memory cell shown in FIGS. 9a through 9d is a SDT junction device that includes a data layer 900 and a soft reference layer 902 separated by an insulating tunnel barrier 901. The insulating tunnel barrier 901 allows quantum mechanical tunneling to occur between the data layer 900 and the soft reference layer 902. This tunneling phenomenon is electron spin dependent, making the resistance of the SDT junction device a function of the relative orientations of the magnetization of the data layer 900 and the soft reference layer 902. For instance, resistance of the SDT junction device is a first value R if the orientation of magnetization of the data layer 900 and the soft reference layer 902 is parallel and a second value (R+ΔR) if the orientation of magnetization is anti-parallel.

The data layer 900 and the soft reference layer 902 both comprise free layers similar to free layer 50 described above with reference to FIG. 2. Accordingly, the orientation of magnetization may be changed in both the data layer 900 and the soft reference layer 902 by applying currents on a word line 14 and a bit line 16w. The memory cell of FIGS. 9a through 9d is written by applying write currents to a word line 14 and a bit line 16w to set a direction of magnetization of the data layer 900 and the soft reference layer 902 to selected direction. Writing the memory cell causes the direction of magnetization in both the data layer 900 and the soft reference layer 902 to be the same. After the write current is removed, magnetic coupling from the data layer 900 to the soft reference layer 902 causes the direction of magnetization of the soft reference layer to reverse direction to be anti-parallel with respect to the data layer. Accordingly, the memory cell is initially in an anti-parallel state in response to seeking the lowest energy state.

Subsequent to being written, the memory cell may be read by applying a write sense current to set the soft reference layer 902 to a known direction of magnetization using a word line 14. In certain embodiments, a write sense current may be applied to bit line 16w along with the write sense current applied on word line 14 to set the soft reference layer 902 to the known direction of magnetization. Setting a current in 16w can help overcome the coercivity of the soft reference layer or reduce the required amount of current in line 14, thus avoiding inadvertent changing of the direction of layer 900. A write sense current comprises a current with a magnitude that is sufficient to set the direction of magnetization of the soft reference layer 902 but is insufficient or below a threshold needed to set the direction of magnetization of the data layer 900. This magnitude is commonly referred to as the coercivity of the cell. In other words, a write sense current may change the state of the soft reference layer 902 but a write sense current does not change the state of the data layer 900. After the soft reference layer has been set to the known direction of magnetization, the memory cell may be in either a parallel or an anti-parallel state.

Figure 9A:
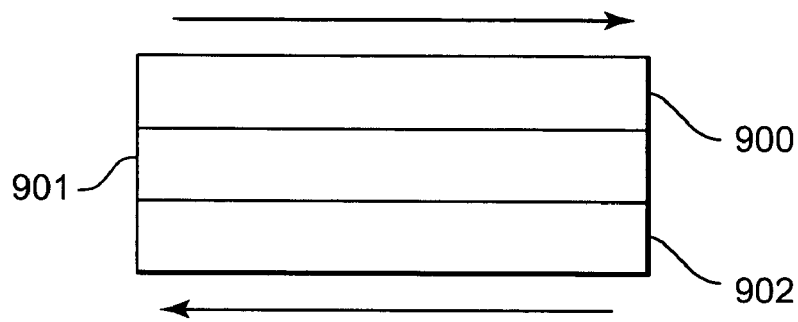
FIG. 9a is a diagram illustrating an embodiment of an MRAM memory cell in a first state.

FIG. 9a illustrates the memory cell after it has been written to a first state. The arrows above and below the memory cell indicate the direction of magnetization of the data layer 900 and the soft reference layer 902, respectively. The first state is defined by the direction of magnetization of the data layer 900 which is shown to be in a rightward direction in FIG. 9a. As noted above, the memory cell is in an anti-parallel state in response to seeking the lowest energy state.

Figure 9B:
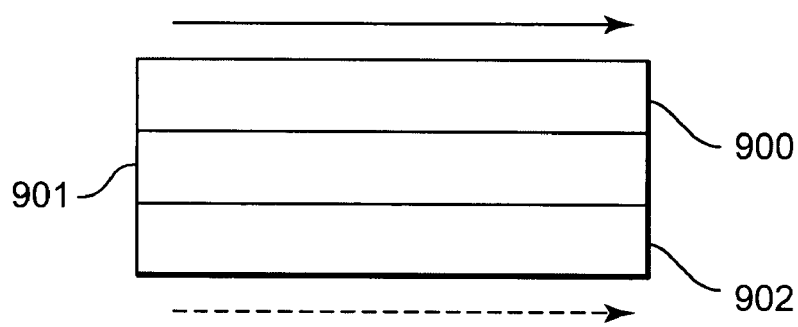

FIG. 9b illustrates reading the first state from the memory cell. A write sense current is applied across the memory cell to set the soft reference layer 902 to a known state, i.e., known direction of magnetization, as indicated by the dotted arrow, which is shown to be in a rightward direction in FIG. 9b. In FIG. 9b, the known direction of magnetization set in the soft reference layer is in the same direction as the direction of magnetization, i.e., the first state, of the data layer 900. Accordingly, the memory cell is in a parallel state in response to the write sense current being applied.

Figure 9C:
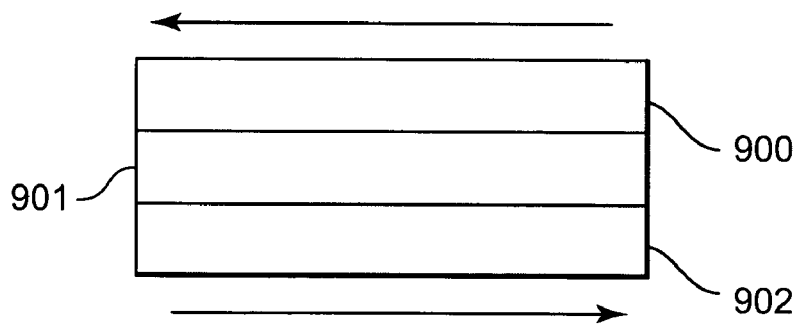
FIG. 9c is a diagram illustrating an embodiment of an MRAM memory cell in a second state.

FIG. 9c illustrates the memory cell after it has been written to a second state. The arrows above and below the memory cell indicate the direction of magnetization of the data layer 900 and the soft reference layer 902, respectively. The second state is defined by the direction of magnetization of the data layer 900 which is shown to be in a leftward direction in FIG. 9c. As noted above, the memory cell is in an anti-parallel state in response to seeking the lowest energy state.

Figure 9D:
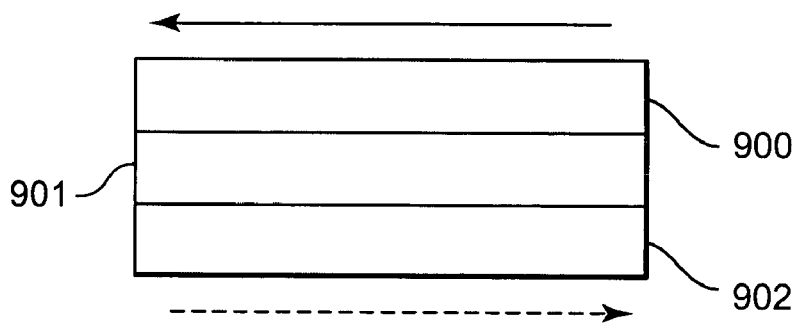
FIG. 9d is a first diagram illustrating applying a write sense current to the MRAM memory cell shown in FIG. 9c.

FIG. 9d illustrates reading the second state from the memory cell. A write sense current is applied across the memory cell to set the soft reference layer 902 to a known state, i.e., known direction of magnetization, as indicated by the dotted arrow, which is shown to be in a rightward direction in FIG. 9d as it is in FIG. 9b. In FIG. 9d, the known direction of magnetization set in the soft reference layer is in the opposite direction as the direction of magnetization, i.e., the second state, of the data layer 900. Accordingly, the memory cell is in an anti-parallel state in response to the write sense current being applied.

Figure 10:
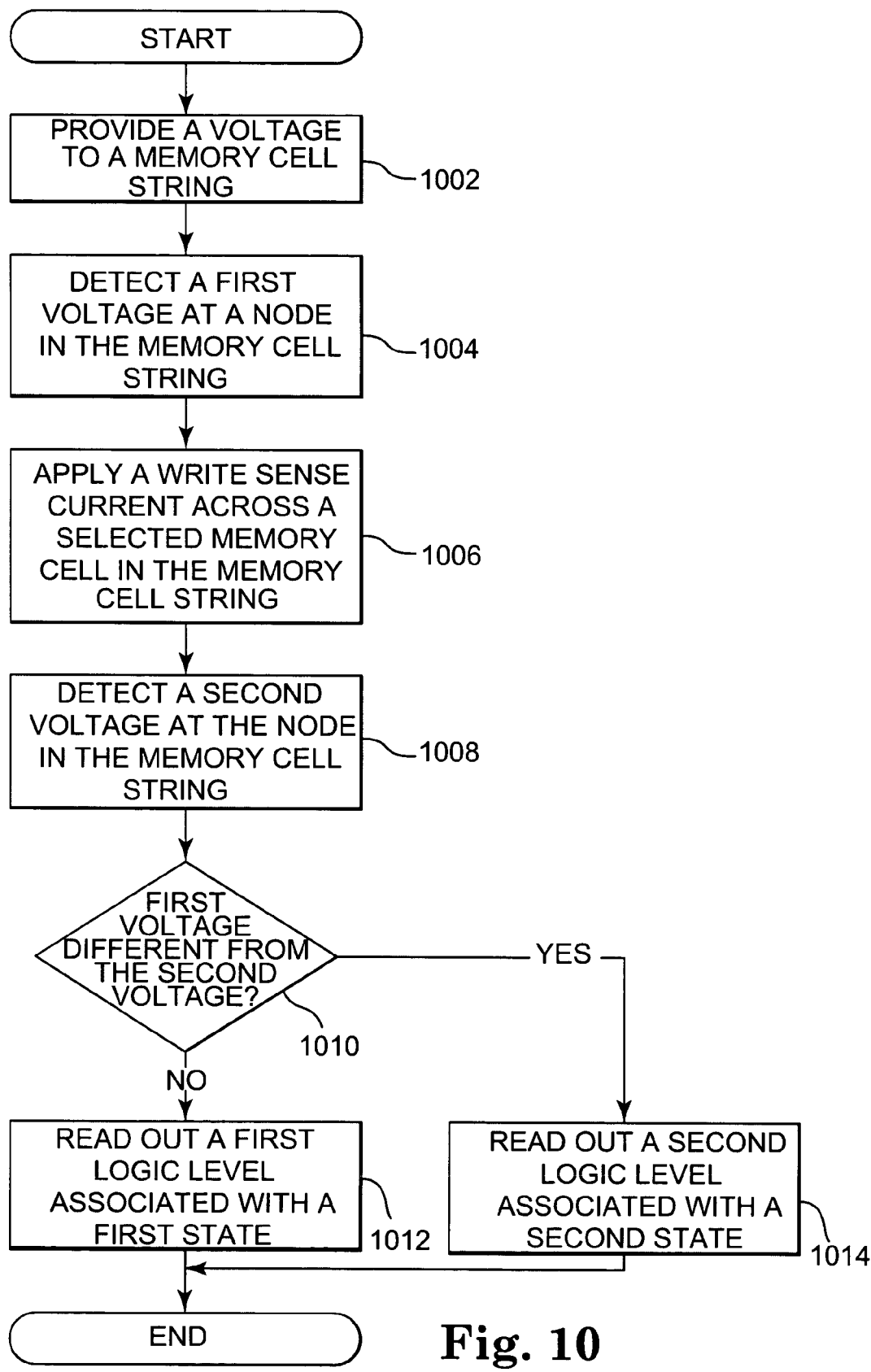
FIG. 10 is a flow chart illustrating an embodiment of a third method for reading a memory cell in a memory cell string.
Figure 11:
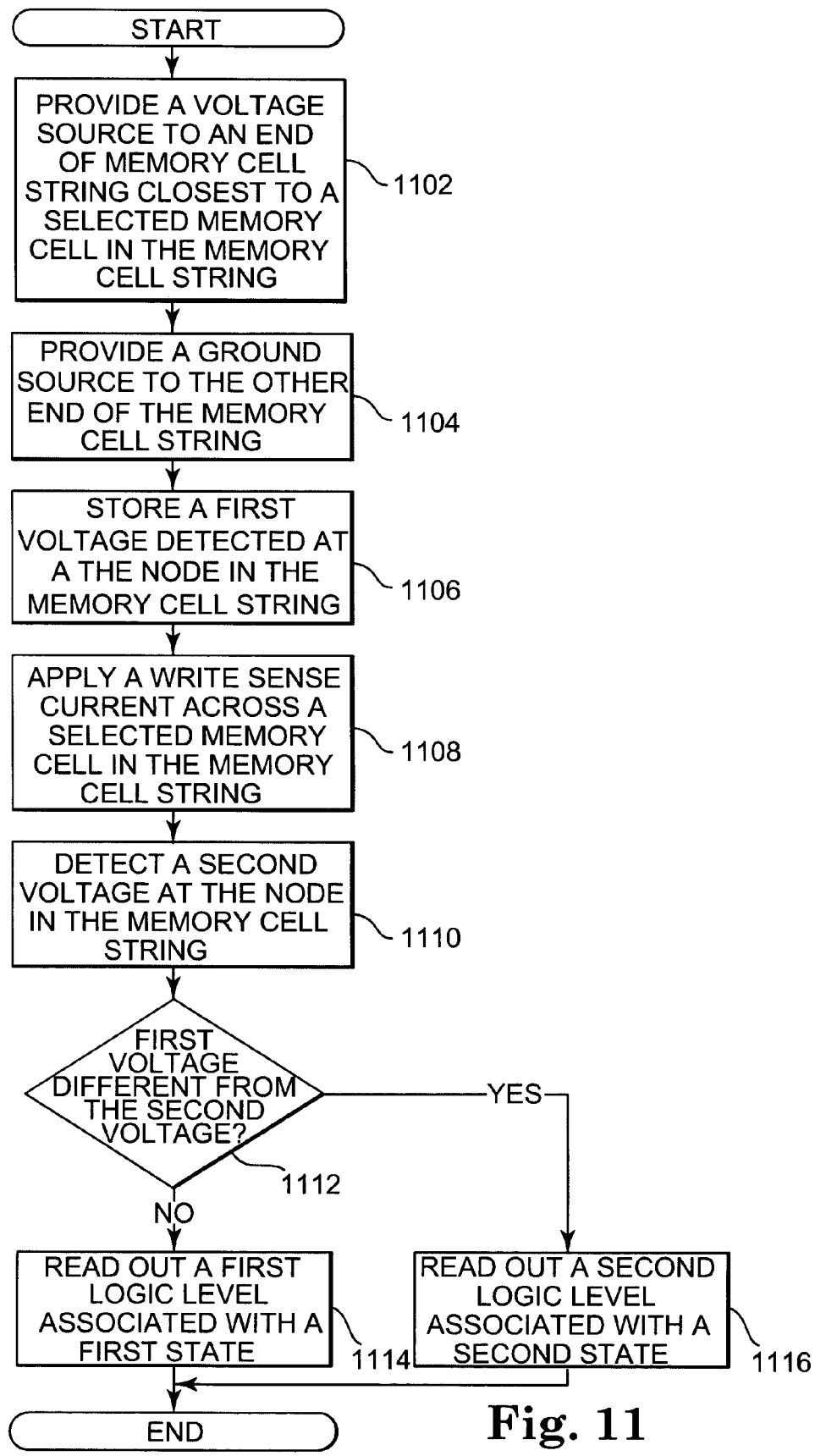
FIG. 11 is a flow chart illustrating an embodiment of a fourth method for reading a memory cell in a memory cell string.

FIG. 10 is a flow chart illustrating an embodiment of a method for reading a memory cell in the embodiment of memory cell string 12 shown in FIG. 3. In the embodiment of FIG. 11, memory cells 70a, 70b, 70c, and 70d each include a soft reference layer 902 as described above with reference to FIGS. 9a through 9d.

In FIG. 10, a voltage, $V_{CC}$, is provided to memory cell string 12 as indicated in a block 1002. A first voltage is detected at a node in memory cell string 12 as indicated in a block 1004. In particular, transistor 72 and switching circuit 74 cause the voltage present at the node $V_G$ between memory cells 70b and 70c at a first point in time to be detected and stored on capacitor 76 as described above with reference to FIG. 3.

A write sense current is applied across a selected memory cell in memory cell string 12, e.g., memory cell 70b, as indicated in a block 1006. The write sense current comprises a current that is applied on a word line 14 across the selected memory cell, e.g., word line 14b for memory cell 70b. The write sense current is of a magnitude that is sufficient to set the soft reference layer 902 of the selected memory cell to a known state, i.e., direction of magnetization, but below a level that would cause the data layer 900 of the selected memory cell to change state, i.e., be written. In certain embodiments, the write sense current also comprises a current that is applied on a bit line 16w across the selected memory cell.

A second voltage is detected at a node in memory cell string 12 as indicated in a block 1008. In particular, transistor 72 and switching circuit 74 cause the voltage present at the node $V_G$ between memory cells 70b and 70c at a second point in time to be detected and provided to the negative input of differential amplifier 78. The second voltage is detected subsequent to the selected memory cell, e.g., memory cell 70b, being written to the first state.

A determination is made by sense amplifier 26 as to whether the first voltage differs from the second voltage as indicated in a block 1010. The determination is made using differential amplifier 78 and signal amplifier 80. If the first voltage does not differ from the second voltage, then a first logic level associated with a first state is read out from the selected memory cell, e.g., memory cell 70b, as indicated in a block 1012. If the first voltage differs from the second voltage, then a second logic level associated with a second state is read out from the selected memory cell, e.g., memory cell 70b, as indicated in a block 1014.

Sense amplifier 26 causes the first or second logic level to be read out from the selected memory cell by causing a "1" or a "0" to be stored in register 30 and to be provided to I/O pad 32.

As noted above, the parallel state and the anti-parallel state cause different resistances to be measured across a memory cell. By applying a voltage across memory cell string 12, a voltage can be detected at a node between memory cells in the string prior to and subsequent to a write sense current being applied across the memory cell. If the application of the write sense current results in a state that matches the state of the selected memory cell before the write sense current was applied, then the resistance of the cell will not change and the voltage detected at the node subsequent to the write will be roughly the same as the voltage detected at the node prior to the write sense current being applied. If the application of the write sense current results in a state that does not match the state of the selected memory cell before the write sense current was applied, then the resistance of the cell will change and the voltage detected at the node subsequent to the write will differ from the voltage detected at the node prior to the write sense current being applied. In this way, memory cell string 12 effectively functions as a voltage divider circuit.

Because the application of the write sense current across the selected memory cell did not change the state of the data layer 900 of the selected memory cell, the selected memory cell does not need to be re-written to its original state.

Control circuit 34 provides appropriate timing signals to row decode circuit 18, column decode circuit 20, read circuit 22, steering circuit 24 and sense amplifier 26 to allow the functions of the method shown in FIG. 10 to be performed.

Any one of the memory cells 70a, 70b, 70c, and 70d may be read using the method just described. Although four memory cells are shown in the memory cell string illustrated in FIG. 3, other memory cell strings may include other numbers of memory cells coupled in series.

FIG. 11 is a flow chart illustrating an embodiment of a method for reading a selected memory cell in the embodiment of memory cell string 12 shown in FIG. 5. In the embodiment of FIG. 11, memory cells 70a, 70b, 70c, and 70d each include a soft reference layer 902 as described above with reference to FIGS. 9a through 9d.

In FIG. 11, a voltage source is provided to an end of a memory cell string 12 closest or nearest to the selected memory cell in the memory cell string as indicated in a block 1102. A ground source is provided to the other end of memory cell string 12 as indicated in a block 1104.

The voltage source and ground source are coupled to cause the selected memory cell to be closest to the supply voltage ($V_A$ or $V_B$) of the voltage divider circuit formed by the voltage source, the ground source, and memory cells 70a, 70b, 70c, and 70d. Accordingly, the end of memory cell string 12 that is closest or nearest to a selected memory cell 70 is the end that would put the selected memory cell between voltage source $V_A$ or $V_B$ and the voltage divider tap node $V_G$. This closest end is coupled to a voltage source $V_A$ or $V_B$ and the end opposite the closest end is coupled to a ground source. The supply voltage $V_A$ or $V_B$ may be coupled to $V_{DD}$.

For example, if memory cell 70a or 70b is selected to be read, then the voltage $V_A$ is applied across memory cell string 12 and the end of memory cell string 12 indicated by $V_B$ is coupled to a ground source. If memory cell 70c or 70d is selected to be read, then the voltage $V_B$ is applied as indicated in FIG. 5 and the end of memory cell string 12 indicated by $V_A$ is coupled to a ground source.

By switching the voltage and ground sources based on the relative position of the selected memory cell in the memory cell string as just described, the signals provided to sense amplifier 26 may be at a desired polarity to allow the design of sense amplifier 26 to be simplified.

A first voltage detected at a node in memory cell string 12 is stored as indicated in a block 1106. In particular, transistor 92, differential amplifier 100, and switch 102 cause the voltage present at the node $V_G$ between memory cells 70b and 70c at a first point in time to be detected and stored on capacitor 104 as described above. A voltage, $V_A$ or $V_B$, is applied to memory cell string 12 to develop a voltage divider voltage to be applied at the gate of transistor 92 to cause a sense voltage to be transmitted to the input of differential amplifier 100. The voltage, $V_A$ or $V_B$, may be equal to $V_{DD}$.

A write sense current is applied across the selected memory cell in memory cell string 12, e.g., memory cell 70b, as indicated in a block 1108. The write sense current comprises a current that is applied on a word line 14 across the selected memory cell, e.g., word line 14b for memory cell 70b. The write sense current is of a magnitude that is sufficient to set the soft reference layer 902 of the selected memory cell to a known state, i.e., direction of magnetization, but below a level that would cause the data layer 900 of the selected memory cell to change state, i.e., be written. In certain embodiments, the write sense current also comprises a current that is applied on a bit line 16w across the selected memory cell.

A second voltage is detected at a node in memory cell string 12 as indicated in a block 1110. In particular, transistor 92, differential amplifier 100, and switch 102 cause the voltage present at the node $V_G$ between memory cells 70b and 70c at a second point in time to be detected and provided to the negative input of differential amplifier 106. The second voltage is detected subsequent to the selected memory cell, e.g., memory cell 70b, being written to the first state.

A determination is made by differential amplifier 106 as to whether the first voltage differs from the second voltage as indicated in a block 1112. If the first voltage does not differ from the second voltage, then a first logic level associated with a first state is read out from the selected memory cell, e.g., memory cell 70b, as indicated in a block 1114. If the first voltage differs from the second voltage, then a second logic level associated with a second state is read out from the selected memory cell, e.g., memory cell 70b, as indicated in a block 1116.

Sense amplifier 26 causes the first or second logic level to be read out from the selected memory cell by causing a "1" or a "0" to be stored in sense latch 110 in register 30 and to be provided to I/O pad 32.

As noted above, memory cell string 12 effectively functions as a voltage divider circuit in the embodiment of FIG. 5.

Because the application of the write sense current across the selected memory cell did not change the state of the data layer 900 of the selected memory cell, the selected memory cell does not need to be re-written to its original state.

Control circuit 34 provides appropriate timing signals to row decode circuit 18, column decode circuit 20, read circuit 22, steering circuit 24 and sense amplifier 26 to allow the functions of the method shown in FIG. 11 to be performed.

Any one of the memory cells 70a, 70b, 70c, and 70d may be read using the method just described. Although four memory cells are shown in the memory cell string illustrated in FIG. 5, other memory cell strings may include other numbers of memory cells coupled in series.

The above embodiments of the MRAM device may offer advantages over other MRAM devices. For example, the a higher level of memory cell densities may be achieved compared to other MRAM devices that include additional elements. Increased densities may result in decreased costs for a given amount of storage capacity. In addition, the memory cell strings described herein may provide better electrical circuit isolation compared to previous MRAM devices. The improved isolation may allow for more reliable detection of the state of memory cells in a memory cell string.

The memory device is not limited to the specific embodiments described and illustrated above. For instance, an MRAM device is not limited to the use of spin dependent tunneling devices. Other types of devices that could be used include, but are not limited to, giant magnetoresistance ("GMR") devices.

The MRAM device has been described in connection with the rows being oriented along the x-axis and columns being oriented along the y-axis. However, the rows and columns could be transposed.

The memory device is not limited to MRAM cells. The memory device may include any type of memory cell in a resistive cross point array.

What is claimed is:

1. A system comprising:
   a memory cell string that includes a first memory cell coupled to a second memory cell;
   a sense amplifier coupled to the memory cell string and configured to:
      detect a first voltage at a node between the first and second memory cells at a first time;
      detect a second voltage at the node at a second time subsequent to a write sense current being applied across the first memory cell;
      compare the first and second voltages; and
      cause a logic level associated with the first memory cell to be stored in response to comparing the first and second voltages.

2. The system of claim 1 further comprising:
   a voltage source coupled to a first end of the memory cell string in response to the first end being closest to the first memory cell; and
   a ground source coupled to a second end of the memory cell string that is opposite the first end of the memory cell string.

3. The system of claim 2 further comprising:
   a first bit line coupled to the sense amplifier and configured to provide the first and second voltages to the sense amplifier, and a second bit line for writing the first and second memory cells.

4. The system of claim 3 further comprising:
   a transistor configured to cause the first and second voltages to be provided on the first bit line.

5. The system of claim 4 wherein the transistor comprises a voltage follower transistor.

6. The system of claim 4 wherein the transistor includes a gate connection, a source connection, and a drain connection, wherein the gate connection is coupled to the node, wherein the source connection is coupled to the first bit line, and where in the drain connection is coupled to a voltage source.

7. The system of claim 3 wherein the sense amplifier includes a first differential amplifier coupled to the first bit line, a switch coupled to the first differential amplifier, and a capacitor coupled to the switch, and wherein the first differential amplifier is configured to cause the first voltage to be stored on the capacitor in response to the switch being closed.

8. The system of claim 7 wherein the sense amplifier includes a current source coupled to the first bit line.

9. The system of claim 7 wherein the sense amplifier includes a resistor coupled to the first bit line.

10. The system of claim 10 wherein the sense amplifier includes a second differential amplifier, and wherein the second differential amplifier is configured to compare the first voltage to the second voltage in response to the switch being open.

11. The system of claim 10 further comprising:
a register configured to store the logic level in response to a signal from the second differential amplifier.

12. A method of performing a read operation from a first memory cell comprising:
providing a first voltage source to a memory cell string that includes a first memory cell coupled to a second memory cell;
providing a ground source to the memory cell string;
providing a second voltage source to a transistor coupled to a node between the first memory cell and the second memory cell and coupled to a bit line that is configured to write the first memory cell in conjunction with a word line; and
determining whether a voltage change occurred at the node in response to applying a first write sense current across the first memory cell using the word line.

13. The method of claim 12 further comprising:
storing a logic level associated with a first state in response to determining that the voltage change occurred.

14. The method of claim 13 further comprising:
storing a logic level associated with a second state in response to determining that the voltage change did not occur.

15. The method of claim 12 further comprising:
determining whether the voltage change occurred at the node in response to applying the first write sense current across the first memory cell using the word line and applying a second write current across the first memory cell using the bit line.

* * * * *